United States Patent
Liu

(10) Patent No.: US 7,200,040 B2
(45) Date of Patent: Apr. 3, 2007

(54) METHOD OF OPERATING P-CHANNEL MEMORY

(75) Inventor: Chih-Cheng Liu, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 51 days.

(21) Appl. No.: 11/162,365

(22) Filed: Sep. 8, 2005

(65) Prior Publication Data

US 2006/0215460 A1 Sep. 28, 2006

(30) Foreign Application Priority Data

Mar. 23, 2005 (TW) ................ 94108908 A

(51) Int. Cl.
*G11C 11/34* (2006.01)

(52) U.S. Cl. .................. 365/185.18; 365/185.28; 365/185.29

(58) Field of Classification Search ........... 365/185.18, 365/185.28, 185.29, 185.14
See application file for complete search history.

(56) References Cited

U.S. PATENT DOCUMENTS

| | | | |
|---|---|---|---|
| 6,288,943 B1 * | 9/2001 | Chi ................. | 365/185.18 |
| 6,671,209 B2 * | 12/2003 | Lin et al. .............. | 365/185.29 |
| 6,720,614 B2 * | 4/2004 | Lin et al. .............. | 257/316 |
| 6,801,456 B1 | 10/2004 | Hsu et al. ............. | 365/185.18 |
| 7,054,196 B2 * | 5/2006 | Chen et al. ........... | 365/185.18 |

OTHER PUBLICATIONS

Article titled "Hot Hole Gate Current in Surface Channel PMOSFETs" jointly offered by Driussi et al., IEEE Electron Device Letters, vol. 22, No. 1, pp. 29-31, Jan. 2001.

* cited by examiner

*Primary Examiner*—Anh Phung
(74) *Attorney, Agent, or Firm*—Jiang Chyun IP Office

(57) ABSTRACT

A method of operating a P-channel memory is described. The P-channel memory includes a substrate, a gate formed over the substrate, a charge trapping structure disposed between the substrate and the gate, and the first and second sources/drains formed in the substrate adjacent to two sides of the charge trapping structure. An erasing operation is performed by applying a first voltage to the second source/drain, applying a second voltage to the first source/drain, applying a third voltage to the gate, and applying a forth voltage to the substrate. Hot holes are injected in the charge trapping structure to erase the P-channel memory by the tertiary hot hole mechanism. The absolute value of the voltage differential between the third and the forth voltages is equal to, or less than 6V, and the second voltage is smaller than the third voltage.

20 Claims, 4 Drawing Sheets

METHOD OF OPERATING P-CHANNEL MEMORY

CROSS-REFERENCE TO RELATED APPLICATION

This application claims the priority benefit of Taiwan application serial no. 94108908, filed on Mar. 23, 2005. All disclosure of the Taiwan application is incorporated herein by reference.

BACKGROUND OF THE INVENTION

1. Field of the Invention

The present invention relates to a method of operating a semiconductor memory, and more particularly, to a method of operating a P-channel memory.

2. Description of the Related Art

Among the various types of non-volatile memory products, electrical erasable and programmable read only memory (EEPROM) device is a memory device that has been widely used inside personal computer systems and electron equipment. In the EEPROM, data can be stored, read out or erased many numerous times and stored data are retained even after power is cut off.

A typical EEPROM includes a doped polysilicon floating gate and a doped polysilicon control gate. In the prior art technology, a charge trapping layer replaces the polysilicon floating gate. The material of the charge trapping layer can be, for example, silicon nitride. In general, an oxide layer is formed both above and below the silicon nitride charge-trapping layer to form a stacked structure including an oxide-nitride-oxide (ONO) composite layer. Read-only memory having this type of stacked gate structure is often referred to as a silicon-oxide-nitride-oxide-silicon (SONOS) memory device.

Generally, the memory devices are classified into P-channel memory and N-channel memory based on the type of channel. Wherein, a channel hot electron injection (CHEI) mode or a Fowler-Hordheim (FN) tunneling effect is used to program or erase the N-channel memory. The operation according to the FN tunneling effect requires high operational voltages, high power consumption and more process time. To enhance electron tunneling efficiency and device integrity, the thickness of the tunnel oxide of the memory is reduced. Due to shrinkage of the device, the interface breakdown voltage of the tunnel oxide declines as well. It cannot stand the high voltage applied for the FN tunneling effect. As a result, issues of increase of leakage current and deterioration of the memory reliability occur.

On the other hand, the P-channel memory has high device integrity, eliminates the reliability issue resulting from the hot hole injection, and generates low electrical field in the oxide layer during the electron injection. The electron injection speed of the P-channel memory is faster than that of the N-channel memory. The P-channel memory also consumes less power and energy, and requires low programming voltages. It thus has been widely used in semiconductor-related fields.

FIG. 1 is a drawing showing a prior art method of operating a P-channel memory. The method is similar to that described in U.S. Pat. No. 6,801,456. The P-channel memory includes the substrate 100, the ONO layer 110 (which is composed of the silicon oxide layer 102, the silicon nitride layer 104 and the silicon oxide layer 106) on the substrate 100, the P-type doped polysilicon gate 120 on the ONO layer 110, and the source 130a and the drain 130b, which are disposed in the substrate 100 adjacent to two sides of the ONO layer 110. During the erasing operation, 0V is applied to the source 130a and the drain 130b; −6V is applied to the gate 120; 6V is applied to the substrate 100. Accordingly, the FN tunneling effect or hot hole injection effect erases the data stored therein.

Since the FN tunneling effect or the hot hole injection effect is used for the P-channel memory, its operational efficiency is low. In order to enhance the operational efficiency, a high voltage should be applied to increase current. During the erasing operation, the voltage differential between the gate 120 and the substrate 100 is 12V. It results in high power consumption and requires more process time. Moreover, the high voltage causes high leakage currents and reduces the reliability of the memory device. In addition, by the device shrinkage, the leakage current issue becomes even more serious. That will restrain the extent to which device dimensions can shrink.

SUMMARY OF THE INVENTION

Accordingly, the present invention is directed to a method of operating a P-channel memory. This method provides low operational voltage, low power consumption, high programming/erasing efficiency, high memory operational speed and high reliability.

The present invention is also directed to a method of operating a P-channel memory. With shrinkage of device dimensions, the electrical performance of the P-channel memory is enhanced and the P-channel memory has high integrity.

The present invention provides a method of operating a P-channel memory. The P-channel memory includes a substrate, a gate formed over the substrate, a charge trapping structure disposed between the substrate and the gate, and a first source/drain and a second source/drain formed in the substrate adjacent two sides of the charge trapping structure. According to this method, a programming operation is performed to inject electrons in the side of the charge trapping structure adjacent to the first source/drain to store a first bit in the P-channel memory. An erasing operation is performed by applying a first voltage to the second source/drain, applying a second voltage to the first source/drain, applying a third voltage to the gate, and applying a fourth voltage to the substrate. Hot holes are injected in the side of the charge trapping structure adjacent to the first source/drain by a tertiary hot hole mechanism to erase the first bit stored in the P-channel memory. Wherein, a voltage differential between the third voltage and the fourth voltage is smaller than or equal to 6V, and the second voltage is smaller than the third voltage.

According to the method of operating the P-channel memory of a preferred embodiment of the present invention, the first voltage described above is about 0V, the second voltage is from about −3V to about −4V, the third voltage is from about −2.5V to about −3.5V, and the fourth voltage is from about 2.8V to about 3.4V.

According to the method of operating the P-channel memory of a preferred embodiment of the present invention, the programming operation is performed by applying a fifth voltage to the second source/drain, applying a sixth voltage to the first source/drain, applying a seventh voltage to the gate, and applying an eighth voltage to the substrate to inject electrons in the side of the charge trapping structure adjacent to the first source/drain and store the first bit in the P-channel memory. Wherein, the sixth voltage is smaller than a seventh voltage, and the seventh voltage is larger than the third voltage. In a preferred embodiment, the fifth voltage is about 0V, the sixth voltage is from about −3V to about −4V, the seventh voltage is from about −0.5V to about −1.5V, and the eighth voltage is from about 0V to about 1V. In addition, a method of injecting the electrons in the charge trapping structure includes a channel hot electron injection (CHEI) method.

According to the method of operating the P-channel memory of a preferred embodiment of the present invention, the method further includes performing the programming operation to inject electrons in the side of the charge trapping structure adjacent to the second source/drain to store a second bit in the P-channel memory; and performing a erasing operation by applying the first voltage to the first source/drain, applying the second voltage to the second source/drain, applying the third voltage to the gate, and applying the fourth voltage to the substrate to inject hot holes in the side of the charge trapping structure adjacent to the second source/drain by a tertiary hot hole mechanism to erase the second bit stored in the P-channel memory. Wherein, the programming operation is performed by applying a fifth voltage to the first source/drain, applying a sixth voltage to the second source/drain, applying a seventh voltage to the gate, and applying an eighth voltage to the substrate to inject electrons in the side of the charge trapping structure adjacent to the second source/drain and store the second first bit in the P-channel memory. The method of injecting the electrons in the charge trapping structure includes a channel hot electron injection (CHEI) method.

According to the method of operating the P-channel memory of a preferred embodiment of the present invention, the material of the gate can be, for example, P-type doped polysilicon, and the charge trapping structure includes silicon oxide/silicon nitride/silicon oxide (ONO).

The present invention provides another method of operating a P-channel memory. The method is adapted for a P-channel silicon/silicon oxide/silicon nitride/silicon oxide/silicon (P-channel SONOS) memory. The P-channel SONOS memory includes at least a P-type substrate, an ONO layer formed over the substrate, a P-type doped polysilicon gate formed over the ONO layer, and a first source/drain and a second source/drain formed in the substrate adjacent to two sides of the ONO layer. According to this method, a programming operation is performed by applying a first voltage to the second source/drain, applying a second voltage to the first source/drain, applying a third voltage to the P-type doped polysilicon gate, and applying a fourth voltage to the substrate to inject electrons in the side of the ONO layer adjacent to the first source/drain to store a first bit in the P-channel SONOS memory. Wherein, the second voltage is smaller than the third voltage. An erasing operation is performed by applying a fifth voltage to the second source/drain, applying a sixth voltage to the first source/drain, applying a seventh voltage to the gate, and applying an eighth voltage to the substrate to inject hot holes in the side of the ONO layer adjacent to the first source/drain by a tertiary hot hole mechanism to erase the first bit stored in the P-channel SONOS memory. Wherein, a voltage differential between the seventh voltage and the eighth voltage is smaller than or equal to 6V, the sixth voltage is smaller than the seventh voltage, and the seventh voltage is smaller than the third voltage.

According to the method of operating the P-channel memory of a preferred embodiment of the present invention, this method further includes: performing the programming operation to inject electrons in the side of the ONO layer adjacent to the second source/drain to store a second bit in the P-channel SONOS memory; and performing the erasing operation by applying a fifth voltage to the first source/drain, applying a sixth voltage to the second source/drain, applying a seventh voltage to the gate, and applying an eighth voltage to the substrate to inject hot holes in the side of the ONO layer adjacent to the second source/drain by a tertiary hot hole mechanism to erase the second bit stored in the P-channel SONOS memory.

According to the method of operating the P-channel memory of a preferred embodiment of the present invention, the programming operation is performed by applying the first voltage to the first source/drain, applying the second voltage to the second source/drain, applying the third voltage to the gate, and applying the fourth voltage to the substrate to inject electrons in the side of the ONO layer adjacent to the second source/drain and store the second bit in the P-channel SONOS memory. The method of injecting the electrons in the charge trapping structure includes a channel hot electron injection (CHEI) method.

According to the method of operating the P-channel memory of a preferred embodiment of the present invention, the first voltage is about 0V, the second voltage is from about −3V to about −4V, the third voltage is from about −0.5V to about −1.5V, the fifth voltage is about 0V, the sixth voltage is from about −3V to about −4V, the seventh voltage is from about −0.5V eighth voltage is from about 2.8V to about 3.4V.

Accordingly, the tertiary hot hole mechanism is used to erase the P-channel memory of the present invention. This method provides low operational voltage, low power consumption, high programming/erasing efficiency, high memory operational speed and high reliability. In addition, since the tertiary hot hole mechanism is generated according to the parallel electrical field, the electrical performance of the memory can be enhanced by shrinking the dimensions of the devices. It also improves the integrity of the device.

The above and other features of the present invention will be better understood from the following detailed description of the preferred embodiments of the invention that is provided in communication with the accompanying drawings.

DESCRIPTION OF SOME EMBODIMENTS

Figure 1:
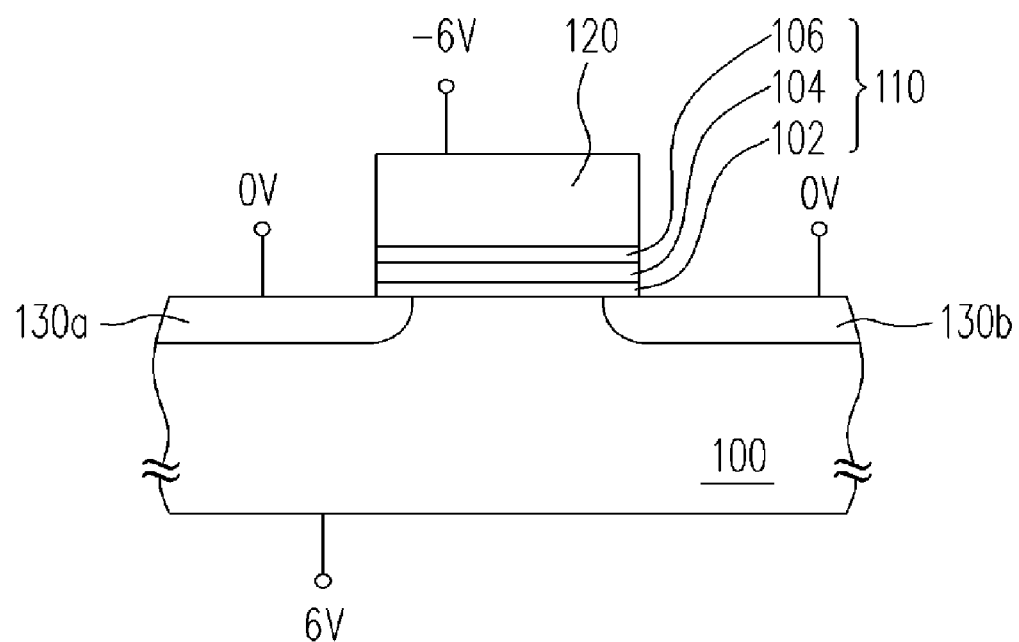
FIG. 1 is a drawing showing a prior art method of operating a P-channel memory.
Figure 2:
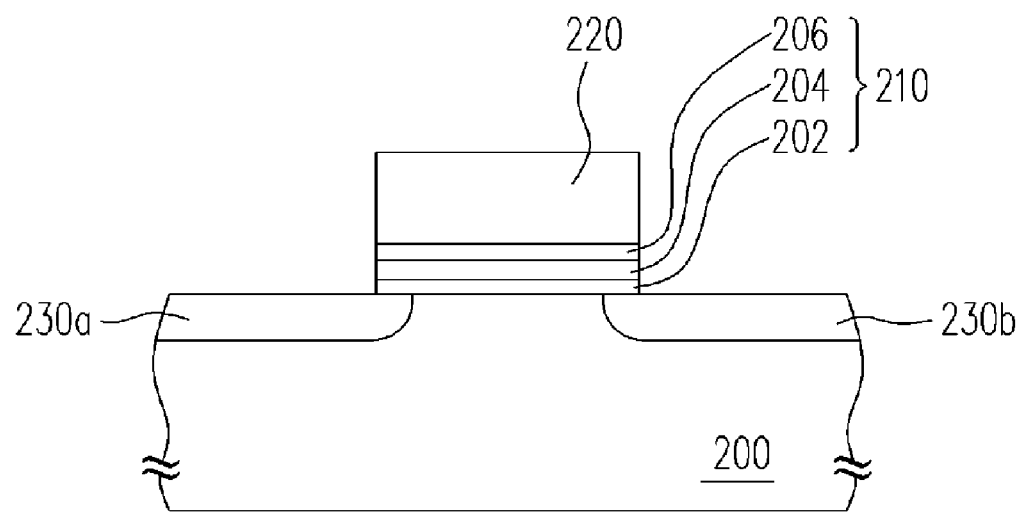
FIG. 2 is a cross sectional view showing a P-channel memory according to a preferred embodiment of the present invention.
Figure 3:
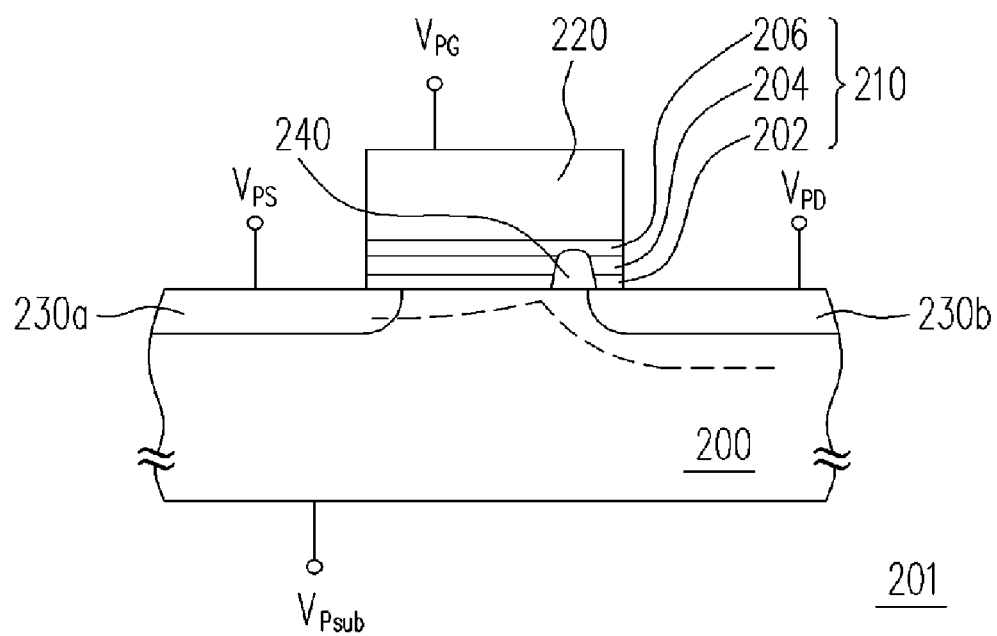
FIG. 3 is a schematic drawing showing a method of programming a P-channel memory according to a preferred embodiment of the present invention.
Figure 4:
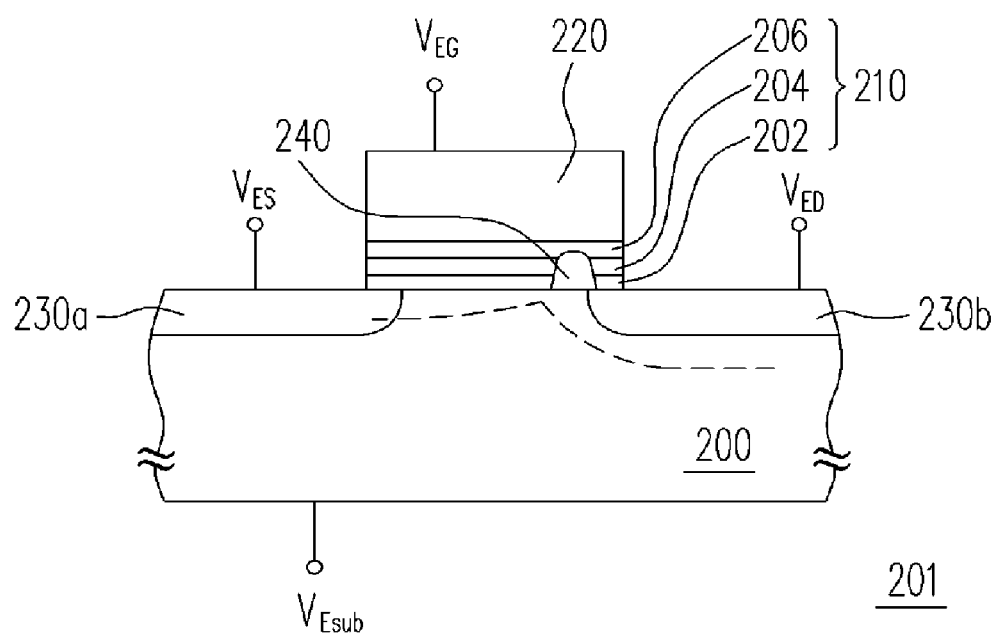
FIG. 4 is a schematic drawing showing a method of erasing a P-channel memory according to a preferred embodiment of the present invention.
Figure 5:
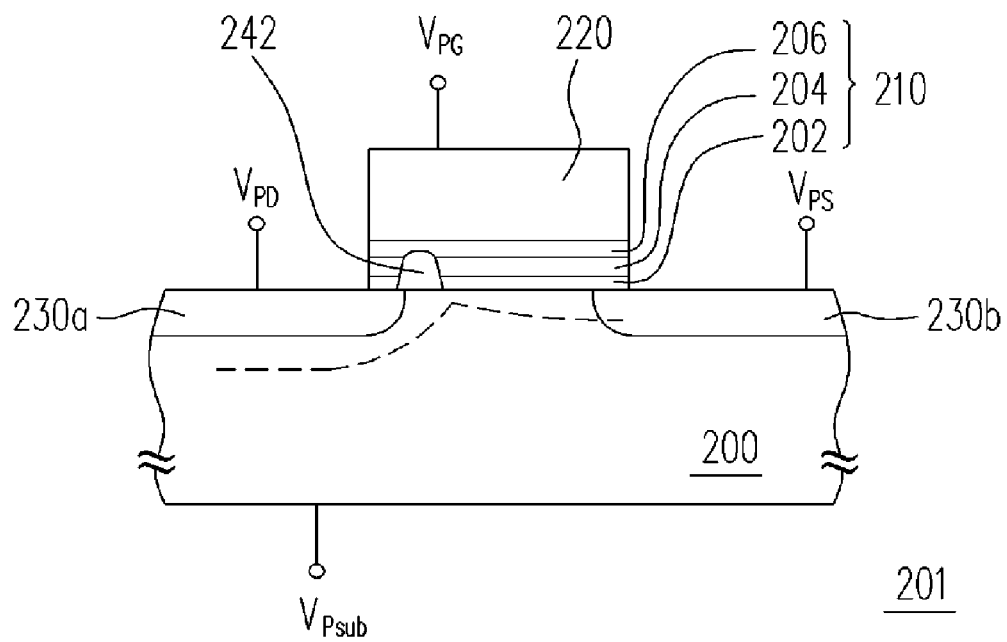
FIG. 5 is a schematic drawing showing another method of programming a P-channel memory according to another preferred embodiment of the present invention.
Figure 6:
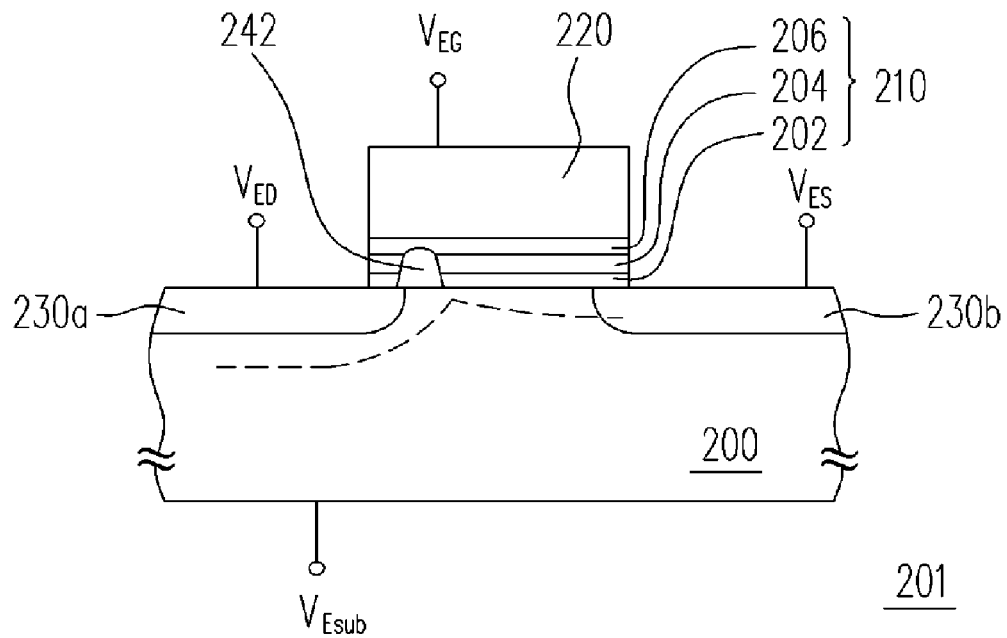
FIG. 6 is a schematic drawing showing another method of erasing a P-channel memory according to another preferred embodiment of the present invention.
Figure 7:
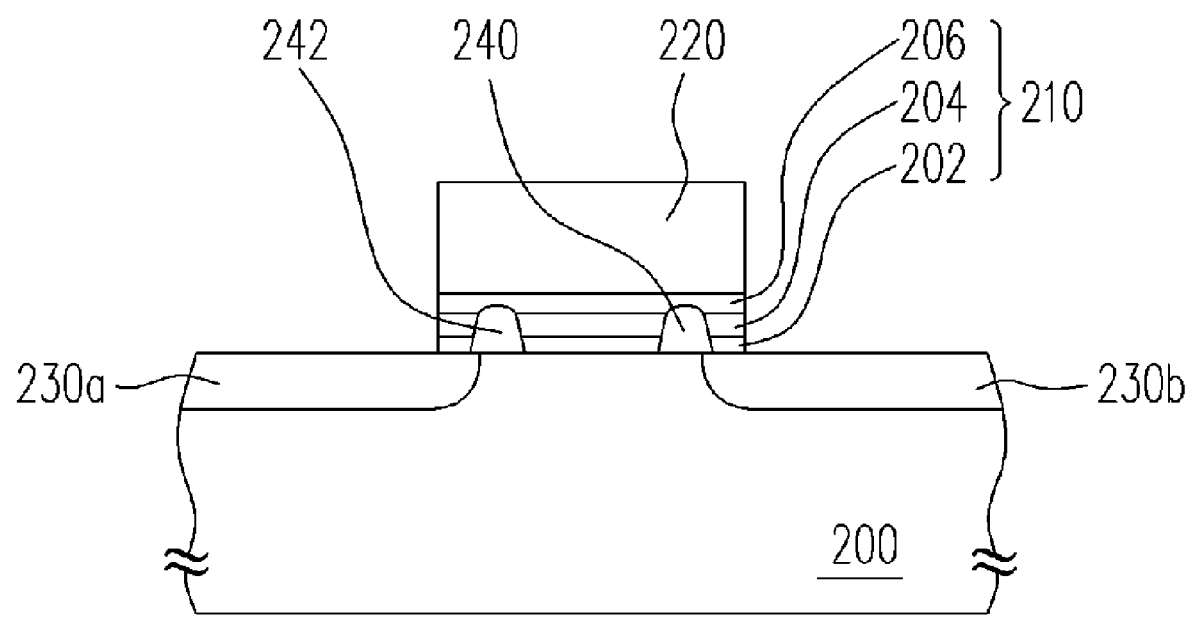
FIG. 7 is a cross sectional view showing a P-channel memory with a two-bit storage function according to a preferred embodiment of the present invention.

FIG. 2 is a cross sectional view showing a P-channel memory according to a preferred embodiment of the present invention. FIG. 3 is a schematic drawing showing a method of programming a P-channel memory according to a preferred embodiment of the present invention. FIG. 4 is a schematic drawing showing a method of erasing a P-channel memory according to a preferred embodiment of the present invention. FIG. 5 is a schematic drawing showing another method of programming a P-channel memory according to another preferred embodiment of the present invention. FIG. 6 is a schematic drawing showing another method of erasing a P-channel memory according to another preferred embodiment of the present invention. FIG. 7 is a cross sectional view showing a P-channel memory with a two-bit storage function according to a preferred embodiment of the present invention.

Referring to FIG. 2, the present invention provides a method of operating a P-channel memory. The P-channel memory 201 includes at least, for example, the substrate 200, the gate 220 formed over the substrate 200, the charge trapping structure 210 between the substrate 200 and the gate 220, and the source/drain 230a and the source/drain 230b formed in the substrate 200 adjacent to two sides of the charge trapping structure 210. Wherein, the charge trapping structure 210 includes, for example, the bottom dielectric layer 202, the charge trapping layer 204 and the top dielectric layer 206.

Referring to FIG. 3, when a programming operation is performed to the P-channel memory 201, the voltage $V_{PD}$, which is from about −3V to about −4V, is applied to the source/drain 230b; the voltage $V_{PS}$, which is about 0V, is applied to the source/drain 230a; the voltage $V_{PG}$, which is from about −0.5V to about −1.5V, is applied to the gate 220; and the voltage $V_{Psub}$, which is from about 0V to about 1V, is applied to the substrate 200. Accordingly, electrons are injected in the side of the charge trapping structure 210 adjacent to the source/drain 230b to store the first bit 240 in the P-channel memory 201. Wherein, the voltage $V_{PD}$ is smaller than the voltage $V_{PG}$. The method of injecting the electrons in the charge trapping structure 210 can be, for example, a channel hot electron injection (CHEI) mode.

Referring to FIG. 4, when the erasing operation is performed to the P-channel memory 201, the voltage $V_{ED}$, which is from about −3V to about −4V, is applied to the source/drain 230b; the voltage $V_{ES}$, which is about 0V, is applied to the source/drain 230a; the voltage $V_{EG}$, which is from about −2.5V to about −3.5V, is applied to the gate 220; and the voltage $V_{Esub}$, which is from about 2.8V to about 3.4V, is applied to the substrate 200. Wherein, the absolute value of the voltage differential between the voltage $V_{EG}$ and the voltage $V_{Esub}$ is smaller than or equal to 6V. The voltage $V_{ED}$ is smaller the voltage $V_{EG}$, and the voltage $V_{EG}$ is smaller than the voltage $V_{PG}$. With the increase of the voltage $V_{Esub}$, the depletion region under the gate 220 becomes larger, and the electrical field is also increased to generate the high energy tertiary hot holes. By the tertiary hot hole mechanism, hot holes are injected in the side of the charge trapping structure 210 adjacent to the source/drain 230b. The holes and the pre-existing electrons are offset. As a result, the first bit 240 stored in the P-channel memory is erased.

Referring to FIGS. 5 and 6, the programming and erasing operations with respect to the second bit 242 are performed to the P-channel memory 201. For example, during the programming operation the voltage $V_{PS}$, which is about 0V, is applied to the source/drain 230b; the voltage $V_{PD}$, which is from about −3V to about −4V, is applied to the source/drain 230a; the voltage $V_{PG}$, which is from about −0.5V to about −1.5V, is applied to the gate 220; and the voltage $V_{Psub}$, which is from about 0V to about 1V, is applied to the substrate 200. The electrons thus are injected in the side of the charge trapping structure 210 adjacent to the source/drain 230a to store the second bit 242 in the P-channel memory 201. Wherein, the voltage $V_{PD}$ is smaller than the voltage $V_{PG}$. The method of injecting the electrons in the charge trapping structure 210 can be, for example, a channel hot electron injection (CHEI) mode.

Referring to FIG. 6, when the erasing operation is performed to the P-channel memory 201, the voltage $V_{ED}$, which is from about −3V to about −4V, is applied to the source/drain 230a; the voltage $V_{ES}$, which is about 0V, is applied to the source/drain 230b; the voltage $V_{EG}$, which is from about −2.5V to about −3.5V, is applied to the gate 220; and the voltage $V_{Esub}$, which is from about 2.8V to about 3.4V, is applied to the substrate 200. Wherein, the absolute value of the voltage differential between the voltage $V_{EG}$ and the voltage $V_{Esub}$ is smaller than or equal to 6V. The voltage $V_{ED}$ is smaller the voltage $V_{EG}$, and the voltage $V_{EG}$ is smaller than the voltage $V_{PG}$. By the tertiary hot hole mechanism, hot holes are injected in the side of the charge trapping structure 210 adjacent to the source/drain 230b to erase the second bit 242 stored in the P-channel memory. Two-bit data store/erase can be operated in a single memory cell.

According to this embodiment, the tertiary hot hole mechanism is used to erase the P-channel memory of the present invention. This method provides low operational voltage, low power consumption, and high memory operational speed. In addition, since the tertiary hot hole mechanism is generated according to the parallel electrical field, the electrical performance of the memory can be enhanced by shrinking the dimensions of the devices. It also improves the integrity of the device.

In the embodiment shown in FIG. 7, the substrate 200 can be, for example, a P-type substrate. The material of the gate 220 can be, for example, a P-type doped polysilicon. The charge trapping structure 210 includes, for example, the bottom dielectric layer 202, the charge trapping layer 204 and the top dielectric layer 206. Wherein, the material of the bottom dielectric layer 202 can be, for example, silicon oxide. The material of the charge trapping layer 204 can be, for example, silicon nitride. The material of the top dielectric layer 206 can be, for example, silicon oxide. These layers constitute the P-channel silicon/silicon nitride/silicon oxide/silicon (P-type SONOS) memory 201. Wherein, the charge trapping structure 210 is an ONO layer. By changing voltages applied to the gate 220 and the source/drain 230a and the source/drain 230b, which are adjacent thereto to trap two groups of electrons, one group of electrons or no electron in the single silicon nitride layer, i.e., the charge trapping layer 204. Accordingly, the P-type SONOS memory 201 can store four states in a cell. It also is called a non-volatile memory storing two bits in a single cell.

According to the method of operating the P-type SONOS memory 201, the electrons are injected in the side of the ONO layer, i.e., the charge trapping structure 210, adjacent to the source/drain 230b to store the first bit 240. By the tertiary hot hole mechanism, hot holes are injected in the ONO layer, i.e., the charge trapping structure 210, adjacent to the source/drain 230b to erase the first bit 240.

Moreover, the programming and erasing operations with respect to the second bit 242 are performed to the P-channel memory 201. For example, electrons are injected in the ONO layer, i.e., the charge trapping structure 210, adjacent to the source/drain 230a to store the second bit 242. By the tertiary hot hole mechanism, hot holes are injected in the ONO layer, i.e., the charge trapping structure 210, adjacent to the source/drain 230a to erase the second bit 242.

Note that the ONO layer is illustrated as the charge trapping structure 210 in the embodiments and figures described above; the bottom dielectric layer 202 and the top dielectric layer 204, however, can be other isolation materials. The material of the charge trapping layer 206 is not limited to silicon nitride. It can be other material layer, such as a tantalum oxide layer, a strontium titanium oxide or a hafnium oxide layer, which is adapted to trap charges therein. In addition, the material of the gate 220 is not limited to the P-type doped polysilicon. It can be metal, metal silicide, or other suitable conductive materials.

Accordingly, the tertiary hot hole mechanism is used to erase the P-channel memory of the present invention. This method provides low operational voltage, low power consumption, high programming/erasing efficiency, high memory operational speed and high reliability. In addition, since the tertiary hot hole mechanism is generated according to the parallel electrical field, the electrical performance of the memory can be enhanced by shrinking the dimensions of the devices. It also improves the integrity of the device.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of operating a P-channel memory having a substrate, a gate formed over the substrate, a charge trapping structure disposed between the substrate and the gate, and a first source/drain and a second source/drain formed in the substrate adjacent two sides of the charge trapping structure, the method comprising:
   performing a programming operation to inject electrons in the side of the charge trapping structure adjacent to the first source/drain to store a first bit in the P-channel memory; and
   performing an erasing operation by applying a first voltage to the second source/drain, applying a second voltage to the first source/drain, applying a third voltage to the gate, and applying a fourth voltage to the substrate to inject hot holes in the side of the charge trapping structure adjacent to the first source/drain by a tertiary hot hole mechanism to erase the first bit stored in the P-channel memory, wherein a voltage differential between the third voltage and the fourth voltage is smaller than or equal to 6V, and the second voltage is smaller than the third voltage.

2. The method of claim 1, wherein the first voltage is about 0V.

3. The method of claim 1, wherein the second voltage is from about −3V to about −4V.

4. The method of claim 1, wherein the third voltage is from about −2.5V to about −3.5 V.

5. The method of claim 1, wherein the fourth voltage is from about 2.8V to about 3.4V.

6. The method of claim 1, wherein the step of performing a programming operation comprises: applying a fifth voltage to the second source/drain, applying a sixth voltage to the first source/drain, applying a seventh voltage to the gate, and applying an eighth voltage to the substrate to inject electrons in the side of the charge trapping structure adjacent to the first source/drain and store the first bit in the P-channel memory, wherein the sixth voltage is smaller than a seventh voltage, and the seventh voltage is larger than the third voltage.

7. The method of claim 6, wherein the fifth voltage is about 0V.

8. The method of claim 6, wherein the sixth voltage is from about −3V to about −4V.

9. The method of claim 6, wherein the seventh voltage is from about −0.5V to about −1.5V.

10. The method of claim 6, wherein the eighth voltage is from about 0V to about 1V.

11. The method of claim 6, wherein a method of injecting the electrons in the charge trapping structure comprises a channel hot electron injection (CHEI) method.

12. The method of claim 6, further comprising:
   performing a programming operation to inject electrons in the side of the charge trapping structure adjacent to the second source/drain to store a second bit in the P-channel memory; and
   performing a erasing operation by applying the first voltage to the first source/drain, applying the second voltage to the second source/drain, applying the third voltage to the gate, and applying the fourth voltage to the substrate to inject hot holes in the side of the charge trapping structure adjacent to the second source/drain by a tertiary hot hole mechanism to erase the second bit stored in the P-channel memory.

13. The method of claim 12, wherein the step of performing the programming operation comprises: applying a fifth voltage to the first source/drain, applying a sixth voltage to the second source/drain, applying a seventh voltage to the gate, and applying an eighth voltage to the substrate to inject electrons in the side of the charge trapping structure adjacent to the second source/drain and store the second bit in the P-channel memory.

14. The method of claim 12, wherein a method of injecting the electrons in the charge trapping structure comprises a channel hot electron injection (CHEI) method.

15. The method of claim 1, wherein the charge trapping structure comprises silicon oxide/silicon nitride/silicon oxide (ONO).

16. A method of operating a P-channel memory, adapted for a P-channel silicon/silicon oxide/silicon nitride/silicon oxide/silicon (P-channel SONOS) memory having a P-type structure, an ONO layer formed over the substrate, a P-type doped polysilicon gate formed over the ONO layer, and a first source/drain and a second source/drain formed in the substrate adjacent to two sides of the ONO layer, the method comprising:
   performing a programming operation by applying a first voltage to the second source/drain, applying a second voltage to the first source/drain, applying a third voltage to the P-type doped polysilicon gate, and applying a fourth voltage to the substrate to inject electrons in the side of the ONO layer adjacent to the first source/drain to store a first bit in the P-channel SONOS memory, wherein the second voltage is smaller than the third voltage; and
   performing an erasing operation by applying a fifth voltage to the second source/drain, applying a sixth voltage to the first source/drain, applying a seventh voltage to the gate, and applying an eighth voltage to the substrate to inject hot holes in the side of the ONO layer adjacent to the first source/drain by a tertiary hot hole mechanism to erase the first bit stored in the P-channel SONOS memory, wherein a voltage differential between the seventh voltage and the eighth voltage is smaller than or equal to 6V, the sixth voltage is smaller than the seventh voltage, and the seventh voltage is smaller than the third voltage.

17. The method of claim 16, further comprising:
performing a programming operation to inject electrons in the side of the ONO layer adjacent to the second source/drain to store a second bit in the P-channel SONOS memory; and
performing an erasing operation by applying the fifth voltage to the first source/drain, applying the sixth voltage to the second source/drain, applying the seventh voltage to the gate, and applying the eighth voltage to the substrate to inject hot holes in the side of the ONO layer adjacent to the second source/drain by a tertiary hot hole mechanism to erase the second bit stored in the P-channel SONOS memory.

18. The method of claim 17, further comprising:
performing the programming operation by applying the first voltage to the first source/drain, applying the second voltage to the second source/drain, applying the third voltage to the gate, and applying the fourth voltage to the substrate to inject electrons in the side of the ONO layer adjacent to the second source/drain and store the second bit in the P-channel SONOS memory.

19. The method of claim 16, wherein a method of injecting the electrons in the ONO layer comprises a channel hot electron injection (CHEI) method.

20. The method of claim 16, wherein the first voltage is about 0V, the second voltage is from about −3V to about −4V, the third voltage is from about −0.5V to about −1.5V, the fifth voltage is about 0V, the sixth voltage is from about −3V to about −4V, and the seventh voltage is from about −2.5V to about −3.5V, the fourth voltage is from about 0V to about 1 V, and the eighth voltage is from about 2.8V to about 3.4V.

* * * * *